United States Patent
Kenney

[11] Patent Number: 5,930,640
[45] Date of Patent: Jul. 27, 1999

[54] MECHANICAL SUPPORTS FOR VERY THIN STACKED CAPACITOR PLATES

[75] Inventor: Donald McAlpine Kenney, Shelburne, Vt.

[73] Assignee: International Business Machines Corporation, Armonk, N.Y.

[21] Appl. No.: 09/112,559

[22] Filed: Jul. 9, 1998

Related U.S. Application Data

[62] Division of application No. 08/606,259, Feb. 23, 1996, which is a division of application No. 08/703,615, Aug. 21, 1996, abandoned, which is a continuation-in-part of application No. 08/475,237, Jun. 7, 1995, abandoned.

[51] Int. Cl.$^6$ .................................................. H01L 21/8242
[52] U.S. Cl. .......................... 438/396; 438/253; 438/255; 438/398; 438/947; 438/964
[58] Field of Search ................................... 438/254, 255, 438/397, 398, 964, 947

[56] References Cited

U.S. PATENT DOCUMENTS

| 5,155,657 | 10/1992 | Oehrlein et al. | 438/397 |
| 5,196,365 | 3/1993 | Gotou | 438/397 |
| 5,254,503 | 10/1993 | Kenny | 438/398 |
| 5,436,186 | 7/1995 | Hsue et al. | 438/397 |
| 5,455,204 | 10/1995 | Dobuzinsky et al. | 438/397 |

*Primary Examiner*—Peter Toby Brown
*Assistant Examiner*—Toniae M. Thomas
*Attorney, Agent, or Firm*—James M. Leas

[57] ABSTRACT

A stacked capacitor having very thin fins and subminimum dimension supports for the fins is described. The capacitor includes a stack of conductive layers on a substrate. A plurality of subminimum dimension trenches are formed in the stack and a columnar conductive layer lines the trenches in contact with alternate layers of the stack. An insulator lines these alternate layers and the columnar conductive layer and capacitively couples these alternate layers and the columnar conductive layer to a second plate layer that is formed between the alternate layers, within the columnar layers in the trenches, and extending between stacked capacitors.

26 Claims, 3 Drawing Sheets

MECHANICAL SUPPORTS FOR VERY THIN STACKED CAPACITOR PLATES

This application is a divisional of Ser. No. 08/606,259 filed on Feb. 23, 1995, which is a divisional of Ser. No. 08/703,615 filed on Aug. 21, 1996, now abandoned; which is a continuation-in-part of Ser. No. 08/475,237 filed on Jun. 7, 1995, now abandoned.

FIELD OF THE INVENTION

This invention generally relates to semiconductor stacked capacitors. More particularly it relates to a stacked capacitor having a very high surface area per unit volume. Even more particularly, it relates to a stacked capacitor with a plurality of very thin fins having subminimum dimension supports.

BACKGROUND OF THE INVENTION

Stacked capacitors are widely used in dynamic random access memory chips (DRAM). But several problems have been identified with stacked capacitors, including a trade off between capacitance and surface topology. As the size of DRAM cells diminishes with each new generation of technology, improvement is needed in capacitor design to maintain the needed level of capacitance for each cell. Two general techniques have emerged, roughening and multiple stacked layers or fins.

Several techniques have been described for providing structures to texture or roughen the surface of polysilicon electrodes used as capacitor plates. Commonly assigned U.S. Pat. No. 5,254,503, to the present inventor, describes several of these prior art techniques and provides a method of achieving subminimum dimension trenches within a capacitor to substantially increase surface area and capacitance.

Alternatively, commonly assigned U.S. Pat. No. 5,160,987, to Pricer et al., describes a capacitor having a large number of fins. However, adding fins can significantly increase stack height and surface topology to the detriment of subsequent processing steps.

A structure which provides a large number of fins without substantially increasing stack height would be valuable and is provided in this invention.

SUMMARY OF THE INVENTION

It is therefore an object of the present invention to provide a stacked capacitor having a large capacitance per unit volume.

It is a further object of the present invention to provide a stacked capacitor having very thin fins and to provide a process for fabricating a mechanically stable stacked capacitor having very thin fins.

It is a further object of the present invention to provide a stacked capacitor having fins with subminimum dimension mechanical support, thereby enabling fins to be very thin.

It is an advantage of the present invention that the subminimum dimension mechanical support adds to the roughness and area of the capacitor plates.

It is a feature of the present invention that it exploits micromasking to provide subminimum dimension mechanical support for very thin fins.

These and other objects, features, and advantages of the invention are accomplished by a semiconductor process comprising: forming a stack comprising a first fin layer, a second sacrificial layer, and a third fin layer on a substrate; forming a subminimum dimension trench in said stack; depositing a layer of material to form a column within said subminimum dimension trench; and etching said second sacrificial layer, leaving said first and said third fin layers, said third layer finding support from said column.

In another aspect, the present invention is a semiconductor structure comprising: a first stack comprising a first conductive fin layer, a second conductive plate layer, and a third conductive fin layer on a substrate; a subminimum dimension trench in said stack; a columnar conductive layer lining said trench in contact with said first and said third fin layers; and an insulator lining said first and third fin layers and capacitively coupling said first and third fin layers to said second plate layer.

BRIEF DESCRIPTION OF THE DRAWINGS

The foregoing and other objects, features, and advantages of the invention will be apparent from the following detailed description of the invention, as illustrated in the accompanying drawings, in which.

DETAILED DESCRIPTION OF THE INVENTION

The present invention provides a stacked capacitor with a very high area per unit volume. Capacitors utilizing a number of stacked thin layers of conductors, or fins, have previously been formed. However, reports indicate that very long and thin fins tend to deform, and the fins can bend appreciably, so as to touch one another. Thus, up till now, fin thickness needed to be significantly more than required for adequate conductivity; fin thickness needed to be sufficient to also provide for mechanical support during the process step when fins were defined and before they were otherwise supported by later inserted layers.

The present invention provides support for fins, enabling each fin to be extremely thin. Support is provided exploiting rough silicon to provide subminimum dimension columns. While, as noted in the background, rough silicon has previously been used to increase the surface area of a capacitor fin, in the present invention it is exploited both to increase surface area and to provide needed support for very thin fins. In brief, subminimum dimension trenches are etched through layers of alternately doped p– and p+ polysilicon, and these trenches are lined with a thin layer of p+ polysilicon. When p– doped layers are removed, p+ polysilicon hollow columns are left in many locations supporting and electrically interconnecting all the p+ fins remaining in the structure. Because they are supported in many locations, the p+ fins can be deposited significantly thinner than was previously possible without the risk of bending. In addition to providing support for the fins, the subminimum dimension columns also themselves participate in the area of the capacitor, so the support columns do not significantly reduce capacitance per unit volume.

A practical fin thickness is presented in an article "Fabrication of 64M DRAM with i-Line Phase Shift Lithography," by K. Nakagawa et al., published in proceedings of the IEDM, 1990, p. 817. The SEM cross section in FIG. 8 therein shows fins approximately 0.1 $\mu$m thick and protruding a length of about 0.5 $\mu$m from their central support post. If mechanical support could be found so as to avoid fin bending, a fin further thinned by a factor of 5 or 10 would provide equivalent capacitance, while significantly reducing stack height. Or many more fins could be added with the same stack height significantly increasing capacitance. If the approximately 1:5 ratio of fin thickness to fin length illustrated in the Nakagawa paper is about equal to the mechanical limit needed to avoid bending or breaking, then a fin 0.02 μm thick would require support every 0.1 μm. Since, 0.1 μm is well below present practical lithographic resolution limits, a subminimum dimension support system is needed. The present applicant has found that the rough silicon used to enhance capacitor surface area in the '503 patent can also be used to provide subminimum dimension supports for capacitor fins.

Figure 1:
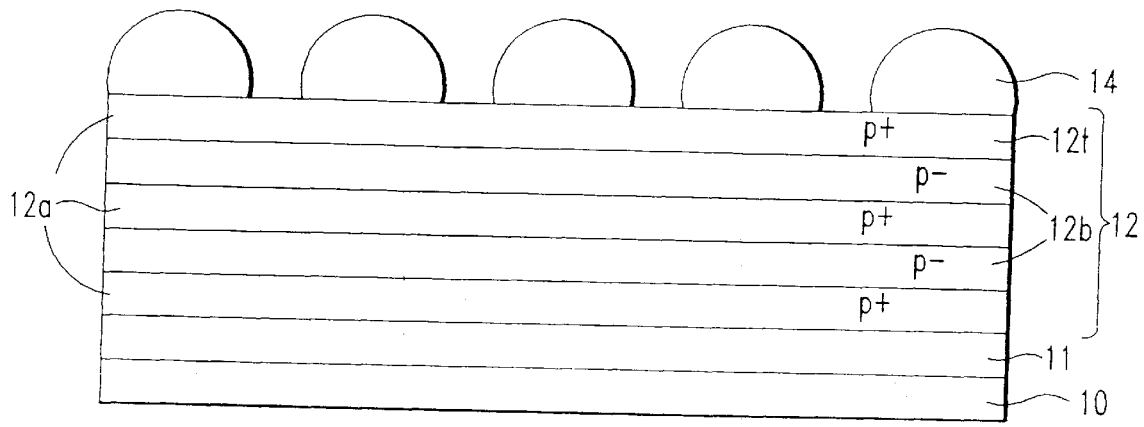
FIGS. 1–8 are cross sectional views illustrating steps in the process of fabricating the capacitor of the present invention.
Figure 2:
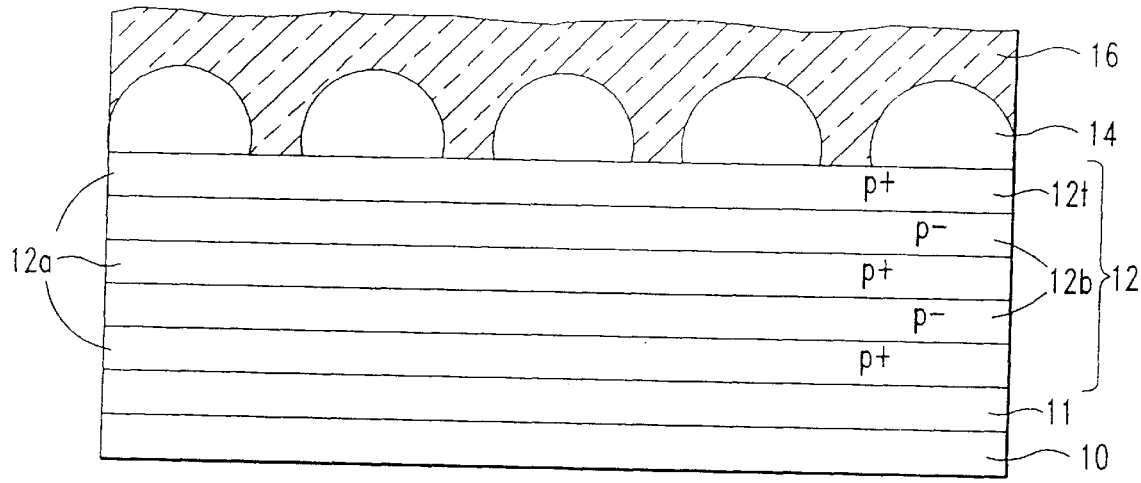

The process for forming capacitors of the present invention is illustrated in FIGS. 1–9. Referring to FIG. 1, there is shown a substrate 10 which may be of any desired material, but is preferably a semiconductor, which may be monocrystalline or polycrystalline. Previous process steps may have been performed on substrate 10 to provide diffusions, transistors, interconnects, and insulators. For example, portions of DRAM cells including transistors, wordlines, and bitlines may be formed in substrate 10 as is well known in the art of stacked capacitors. Substrate 10 can have insulating layer 11 deposited thereon, and a contact to node diffusion 34 of the DRAM cell can be provided through insulator 11 (see FIG. 8).

Figure 8:
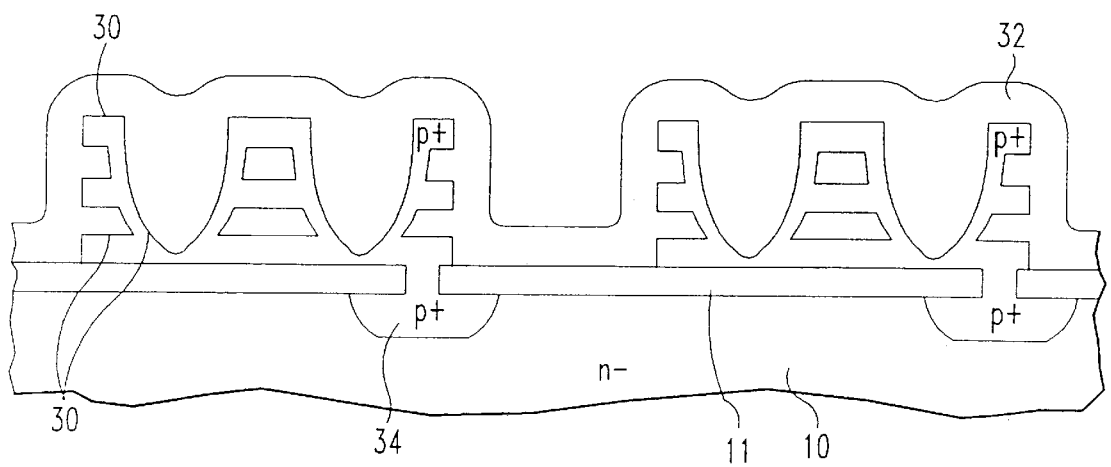

A stack 12 of alternating thin layers 12a and 12b are deposited, such as alternately p+ and p– doped polysilicon layers or alternately n+ doped polysilicon and silicon nitride layers. Preferably, the lowest layer is a heavily doped polysilicon layer to simplify contact with circuitry below. Also preferably, heavily doped layers 12a have the same doping type as node diffusion 34 (FIG. 8). Of course, an intermediate layer or contact stud can be used between node diffusion 34 and the lowest layer of stack 12. For example, if a titanium nitride stud is used for contact through insulating layer 11, then the node diffusion and fins can be of opposite doping type.

A process such as described in the '503 patent, incorporated herein by reference, is then followed to provide irregular surface grains 14 on topmost layer 12t. For example, as shown in FIG. 1, an irregular surface is formed by depositing polysilicon hemispherical shaped grains having a diameter of about 800 Angstrom units or having dimensions of about 20 to 1000 Angstrom units.

Figure 3:
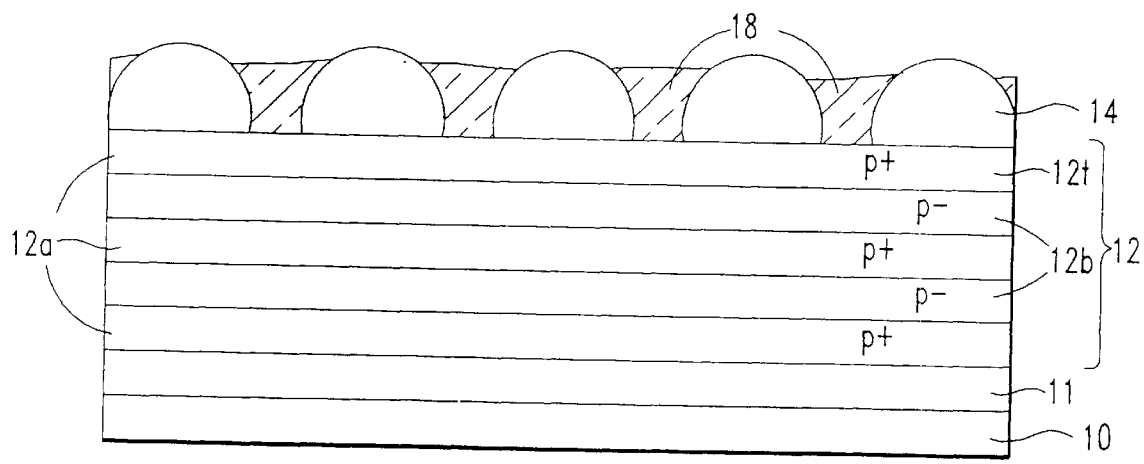

Next, a rough silicon mask is formed around grains 14 by depositing masking layer 16 (FIG. 2) and then selectively etching back masking layer 16 to expose top portions of grains 14 (FIG. 3). Remaining portions of masking layer 16 are left to provide mask 18 used during the next step. Masking material 16 is formed of a material such as silicon dioxide that has different etch properties than grains 14.

Figure 4:
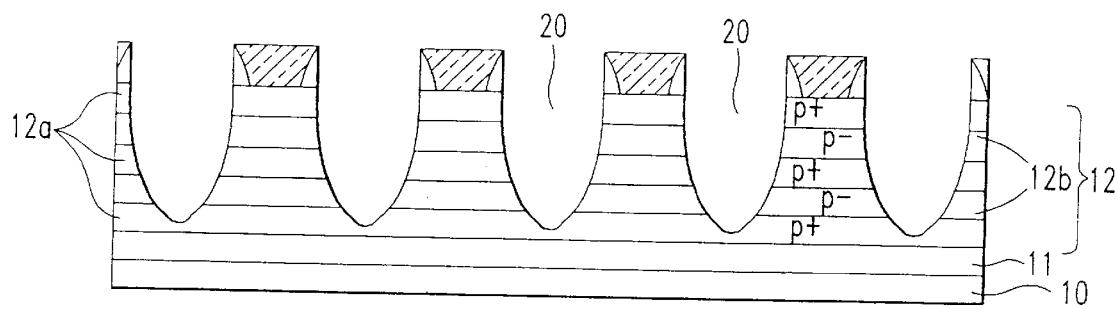

Then, as shown in FIG. 4, exposed portions of grains 14 are selectively etched, leaving mask 18 substantially intact, to form subminimum dimension trenches 20 in grains 14 and in stack 12, stopping on substrate 10, insulating layer 11, or within the lowest layer of stack 12.

Figure 5:
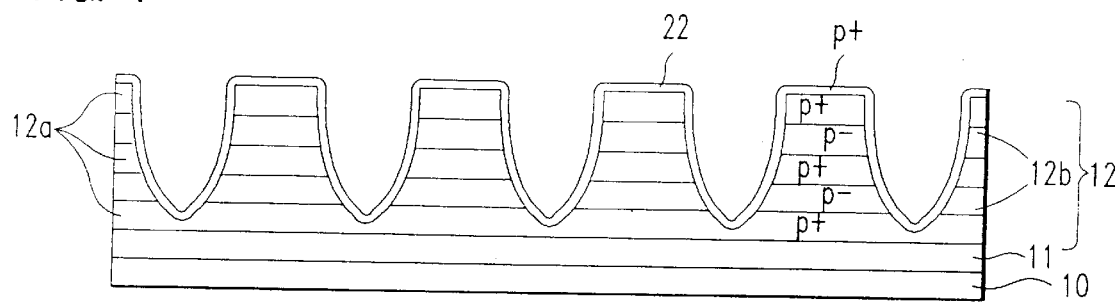

In the next step, shown in FIG. 5, mask 18 is stripped. Then, heavily doped polysilicon layer 22 is deposited along all surfaces, partially filling trenches 20. Polysilicon layer 22 has the same doping as heavily doped layer 12a of stack 12.

Figure 6:
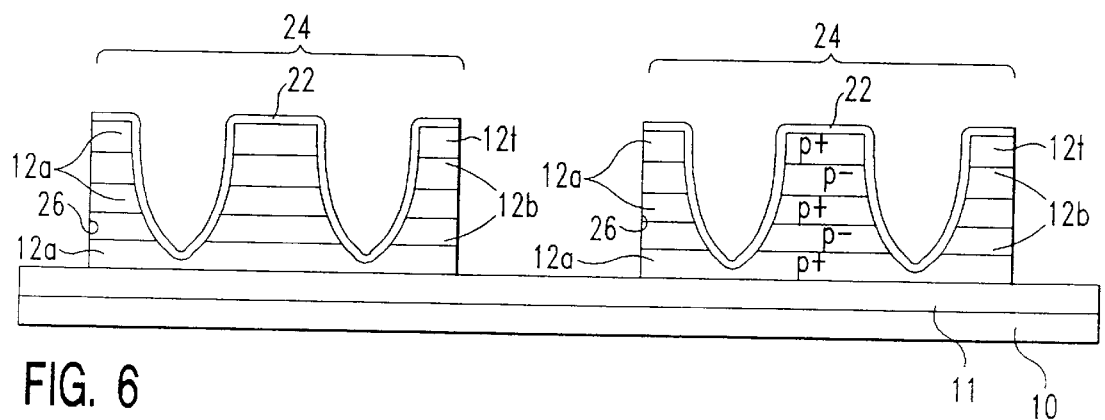

The stacked capacitor defining mask is then printed, and stack 12 is RIE etched leaving individual stacks 24, as shown in FIG. 6. Each stack 24 thereby formed has p+ polysilicon layer 22 on top layer 12t and within trenches 20, but edges of alternating thin layers 12a and 12b are exposed on sidewalls 26 of each stack 24 (FIG. 6a) since individual stacks are formed only after polysilicon layer 22 is deposited.

Figure 7:
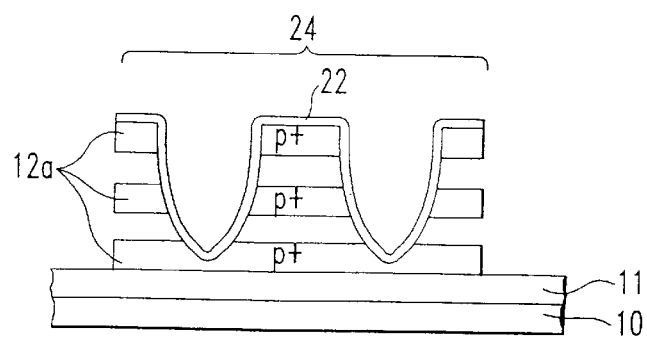
Figure 9:
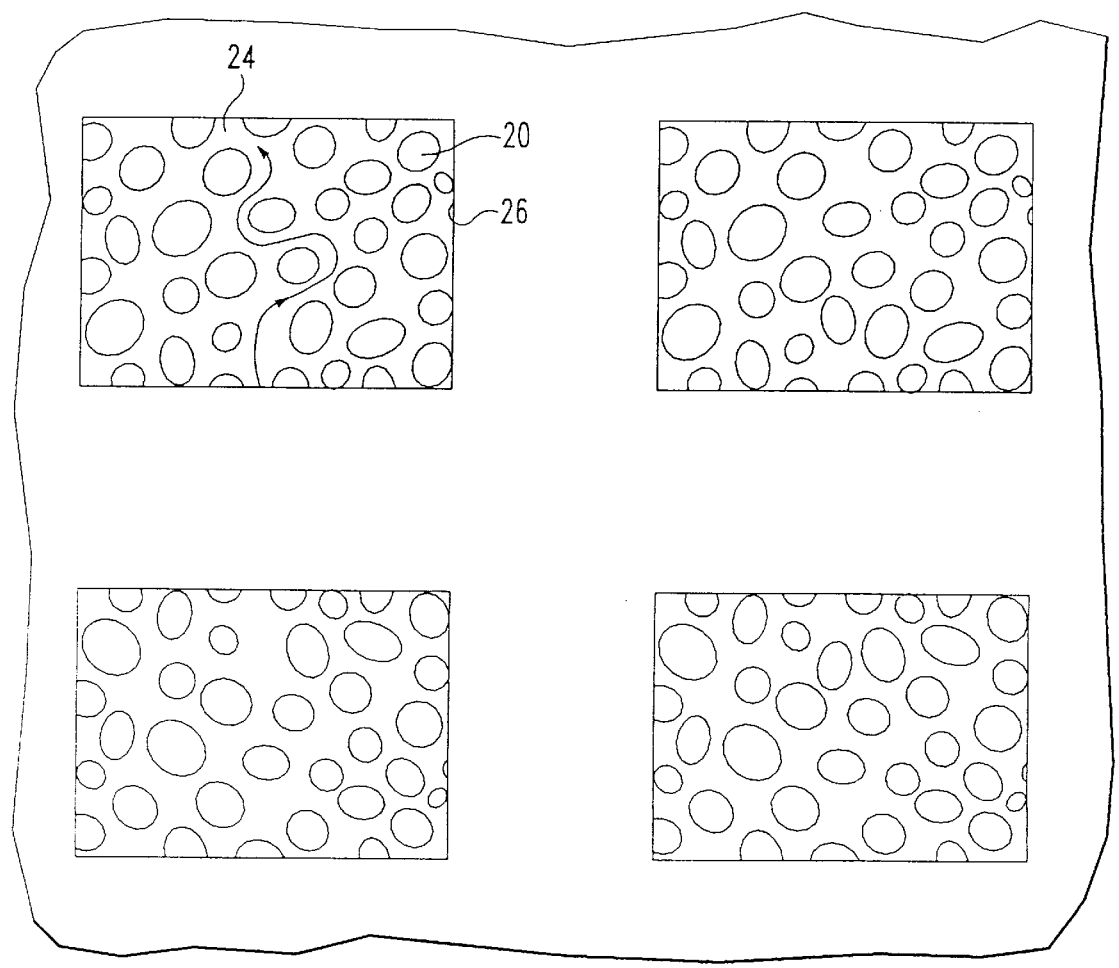
FIG. 9 is a top view of the structure of FIG. 6.

As shown in FIG. 7 and FIG. 9, starting from exposed sidewalls 26, fins are then formed in a selective etch that removes layers 12b leaving layers 12a to serve as fins of a storage node of the stacked capacitor. The etchant penetrates around trenches 20 (indicated by the arrow in FIG. 9) to remove all accessible portions of layers 12b. Heavily doped layers 12a of stack 12 are now supported only by columns of commonly and heavily doped layer 22 lining trenches 20. Selective etchants that attack p– silicon but leave p+ silicon are well known and include KOH. Selective etchants that attack silicon nitride but leave n+ silicon include hot phosphoric acid.

As shown in FIG. 8, capacitors are completed by the conformal formation of capacitor dielectric layer 30, such as silicon dioxide, silicon nitride, tantalum pentoxide, or combinations thereof For simplicity in FIG. 8, capacitor dielectric layer 30 is shown as a single line and the distinction between p+ layer 22 and the p+ fins (layers 12a) is eliminated. Capacitor dielectric layer 30 is formed by thermal or deposition means as is well known in the art.

A layer of conductive material, such as doped polysilicon, is then deposited to form conductive plate 32. Plate 32 not only fills the spaces left by etched out layer 12b and remaining space within trenches 20, it also connects between capacitor stacks 12 to form a common capacitor electrode for an array. conductive plate 34 is formed by deposition using well known techniques and is formed of a material such as doped polysilicon or a metal.

While several embodiments of the invention, together with modifications thereof, have been described in detail herein and illustrated in the accompanying drawings, it will be evident that various further modifications are possible without departing from the scope of the invention. For example, while polysilicon grains are preferred, other materials are capable of providing subminimum dimension structures. Nothing in the above specification is intended to limit the invention more narrowly than the appended claims. The examples given are intended only to be illustrative rather than exclusive.

What is claimed is:

1. A method of forming a semiconductor structure comprising the steps of:
    a) forming a stack comprising a first fin layer, a second sacrificial layer, and a third fin layer on a substrate;
    b) forming a masking pattern on said stack, said masking pattern having an opening having a dimension of about 20 to 1000 Angstrom units;
    c) forming a trench in said stack defined by said masking pattern;
    d) depositing a layer of material to form a column within said trench; and
    e) etching said second sacrificial layer, leaving said first and said third fin layers, said third fin layer finding support from said column.

2. A method as recited in claim 1, wherein said substrate is silicon.

3. A method as recited in claim 1, wherein said first and third fin layers are conductors.

4. A method as recited in claim 3, wherein said first and third fin layers are heavily doped polysilicon having a first conductivity type.

5. A method as recited in claim 1, wherein said column comprises a conductor in contact with said first and said third fin layers.

6. A method as recited in claim 5, wherein said column is heavily doped polysilicon having a first conductivity type.

7. A method as recited in claim 1, wherein said second layer is a material having a different etch property than said first and said third fin layers.

8. A method as recited in claim 1, wherein said second layer is one from the group of an insulator and lightly doped polysilicon.

9. A method as recited in claim 1, farther comprising a plurality of said trenches in said stack.

10. A method as recited in claim 1, wherein in said trench forming step (b), said trench extends to said first fin in said stack.

11. A method as recited in claim 10, wherein in said step (b), said step of forming a trench in said stack comprises the step of forming on the stack a non-planar region including a relief pattern having irregularities on its surface.

12. A method as recited in claim 11, wherein said step of forming a non-planar region including a relief pattern having irregularities comprises the step of depositing grains.

13. A method as recited in claim 12, said grains having a dimension of about 20 to 1000 Angstrom units.

14. A method as recited in claim 12, wherein said step of forming a masking pattern further comprises the steps of depositing a masking layer and then etching back said masking layer to expose top portions of said grains.

15. A method as recited in claim 14, further comprising the step of selectively etching exposed portions of said grains to form said masking pattern.

16. A method as recited in claim 1, in said masking pattern forming step (b), said masking pattern having a plurality of openings having a dimension of about 20 to 1000 Angstrom units said plurality of openings being in a random pattern on said stack, said trench forming step comprising forming a plurality of said trenches said depositing step (c) comprises depositing a layer of material t form a plurality of said columns, one column within each of said plurality of trenches, wherein in said etching step (d) said plurality of columns provide support for said third fin layer at a plurality of locations in said stack.

17. A method of forming a semiconductor structure comprising the steps of:

a) forming a stack comprising an alternate layer on a fin layer;

b) forming a random masking pattern on said stack having dimensions of about 20 to 1000 Angstrom units;

c) forming a plurality of trenches in said stack defined by said masking pattern;

d) depositing a layer of material on said stack and forming a column in each of said trenches, said material contacting said fin layer in each of said trenches; and e) etching said alternate layer.

18. A method as recited in claim 17, wherein in said step (b) said step of forming a masking pattern on said stack comprises the step of forming on the stack a non-planar region including a relief pattern having irregularities on its surface.

19. A method as recited in claim 18, wherein said step of forming a non-planar region including a relief pattern having irregularities comprises the step of depositing grains.

20. A method as recited in claim 19, said grains having a dimension of about 20 to 1000 Angstrom units.

21. A method as recited in claim 20, wherein said step of forming a masking pattern further comprises the steps of depositing a masking layer and then etching back said masking layer to expose top portions of said grains.

22. A method as recited in claim 21, wherein said step of forming a masking pattern further comprises the step of selectively etching, exposed portions of said grains.

23. A method as recited in claim 17, said fin layer being heavily doped polysilicon having a first conductivity type.

24. A method as recited in claim 17, said layer of material comprising a conductor, said conductor in electrical contact with said fin layer.

25. A method as recited in claim 23, said layer of material being, heavily doped polysilicon having said first conductivity doping type.

26. A method as recited in claim 17, said stack further comprising a plurality of fin layers separated by an alternate layer, wherein in said depositing step (d) said material contacting each of said plurality of fin layers, said plurality of columns providing support for said fin layers at a plurality of locations in said stack.

* * * * *